United States Patent
Kim et al.

(10) Patent No.: US 10,825,674 B2
(45) Date of Patent: Nov. 3, 2020

(54) APPARATUS AND METHOD FOR MASS SPECTROMETRY, AND METHOD FOR ANALYZING SEMICONDUCTOR WAFER

(71) Applicants: SAMSUNG ELECTRONICS CO., LTD., Suwon-si, Gyeonggi-Do (KR); Industry-Academic Cooperation Foundation, Yonsei University, Seoul (KR)

(72) Inventors: Kook Joo Kim, Seongnam-si (KR); KiJu Um, Seoul (KR); Cheol Sang Yoon, Seoul (KR); KangTaek Lee, Seoul (KR)

(73) Assignees: SAMSUNG ELECTRONICS CO., LTD., Suwon-si, Gyeonggi-Do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 78 days.

(21) Appl. No.: 16/289,168

(22) Filed: Feb. 28, 2019

(65) Prior Publication Data

US 2019/0279856 A1 Sep. 12, 2019

(30) Foreign Application Priority Data

Mar. 6, 2018 (KR) .................. 10-2018-0026121

(51) Int. Cl.
*H01J 49/00* (2006.01)
*H01J 49/16* (2006.01)
*H01L 21/67* (2006.01)

(52) U.S. Cl.
CPC ...... *H01J 49/164* (2013.01); *H01L 21/67276* (2013.01)

(58) Field of Classification Search
CPC .. H01J 49/164; H01L 21/67276; H01L 22/12; G01N 27/628

(Continued)

(56) References Cited

U.S. PATENT DOCUMENTS

| 6,288,390 B1 * | 9/2001 | Siuzdak | H01J 49/0418 250/288 |
|---|---|---|---|
| 7,122,792 B2 * | 10/2006 | Chen | H01J 49/164 250/288 |

(Continued)

FOREIGN PATENT DOCUMENTS

| JP | 5851378 | 2/2016 |
|---|---|---|
| JP | 2017-024939 | 2/2017 |
| KR | 10-1227890 | 1/2013 |

OTHER PUBLICATIONS

Dong, et al ("Graphene as a novel matrix for the analysis of small molecules by MALDI-TOF MS" Anal. Chem. 2010, 82, 6208-6214)(Year: 2010).*

(Continued)

*Primary Examiner* — Michael Maskell
(74) *Attorney, Agent, or Firm* — F. Chau & Associates, LLC

(57) ABSTRACT

An apparatus for mass spectrometry includes a plate on which a semiconductor wafer including an organic matter is disposed. A hybrid provider provides a ZnO-graphene hybrid to a predetermined region on the semiconductor wafer. A mass analyzer detects the organic matter in the predetermined region using laser desorption/ionization mass spectrometry (LDI-MS).

20 Claims, 11 Drawing Sheets

(58) Field of Classification Search
USPC .................................. 250/281, 282, 287, 288
See application file for complete search history.

(56) References Cited

U.S. PATENT DOCUMENTS

| | | | |
|---|---|---|---|
| 7,842,432 B2 | 11/2010 | Niu et al. | |
| 8,319,178 B2 | 11/2012 | Murakami | |
| 8,611,070 B2 | 12/2013 | Ivanovici et al. | |
| 9,518,960 B2 | 12/2016 | Nema et al. | |
| 9,768,355 B2 | 9/2017 | El-Shall et al. | |
| 2012/0261567 A1* | 10/2012 | Voorhees | H01J 49/0418 |
| | | | 250/282 |

OTHER PUBLICATIONS

Kookjoo Kim et al., "Wafer-Level Detection of Organic Contamination by ZnO—rGO Hybrid-Assisted Laser Desportation/Ionization Time-Of-Flight Mass Spectrometry", Elsevier, Talanta 182, (2018), pp. 273-278.

* cited by examiner

US 10,825,674 B2

APPARATUS AND METHOD FOR MASS SPECTROMETRY, AND METHOD FOR ANALYZING SEMICONDUCTOR WAFER

CROSS-REFERENCE TO RELATED APPLICATION

This application claims priority under 35 USC § 119 to Korean Patent Application No. 10-2018-0026121, filed on Mar. 6, 2018, in the Korean Intellectual Property Office, the disclosure of which is incorporated by reference herein in its entirety.

1. Technical Field

Exemplary embodiments of the present inventive concept relate to an apparatus and a method for mass spectrometry, and more particularly, to a method for analyzing a semiconductor wafer.

2. Discussion of Related Art

To increase the performance and the production yield of semiconductor devices, the possible presence of contaminants created during processes of fabricating the semiconductor devices may be analyzed. As semiconductor devices become increasingly highly integrated, it may become more difficult to analyze a contaminant that remains on a region of a semiconductor wafer during processes of fabricating semiconductor devices.

To analyze a contaminant remaining on a part of a semiconductor device, matrix-assisted laser desorption/ionization mass spectrometry (MALDI-MS) may be used, for example. The MALDI-MS is a technique for evaporation or ionization with minimal fragmentation of an analyte, and is generally known as a technique that can be applied to biopolymers or synthetic polymers that have a relatively large molecular weight and are relatively unstable to heat. However, it may be difficult to use the MALDI-MS in analyzing analyte having a molecular weight below 1,000 Da due to matrix interference.

SUMMARY

An exemplary embodiment of the present inventive concept provides an apparatus for mass spectrometry and a method for analyzing a semiconductor wafer that can analyze a contaminant having a relatively low molecular weight remaining on a region of a semiconductor wafer.

An exemplary embodiment of the present inventive concept provides an apparatus and a method for mass spectrometry that can analyze a regional analyte having a low molecular weight.

An exemplary embodiment of the present inventive concept provides a method for fabricating a semiconductor package by which the reliability can be increased.

According to an exemplary embodiment of the present inventive concept, an apparatus for mass spectrometry includes a plate on which a semiconductor wafer including an organic matter is disposed. A hybrid provider provides a ZnO-graphene hybrid to a predetermined region on the semiconductor wafer. A mass analyzer detects the organic matter in the predetermined region using laser desorption/ionization mass spectrometry (LDI-MS).

According to an exemplary embodiment of the present inventive concept, an apparatus for mass spectrometry includes a plate on which a substrate including an analyte is disposed. A hybrid provider provides a ZnO-graphene hybrid to be adsorbed on the analyte. A mixed sample is produced on the substrate. A light irradiation unit irradiates light to ionize the analyte, to generate an ionized analyte. An ion detection unit detects the ionized analyte to generate mass data of the analyte.

According to an exemplary embodiment of the present inventive concept, a method for mass spectrometry includes preparing a semiconductor wafer including an organic matter. The method includes providing a ZnO-graphene hybrid to a predetermined region the semiconductor wafer. The method includes detecting the organic matter in the predetermined region using laser desorption/ionization mass spectrometry (LDI-MS).

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
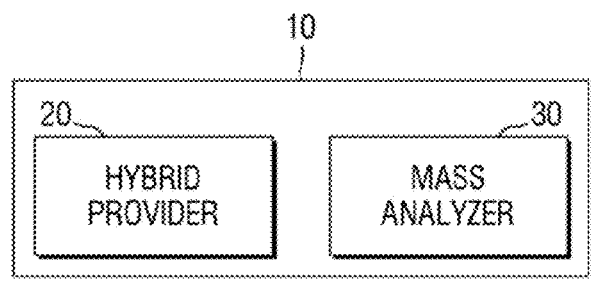
FIG. 1 is a block diagram of an apparatus for mass spectrometry according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

Figure 2A:
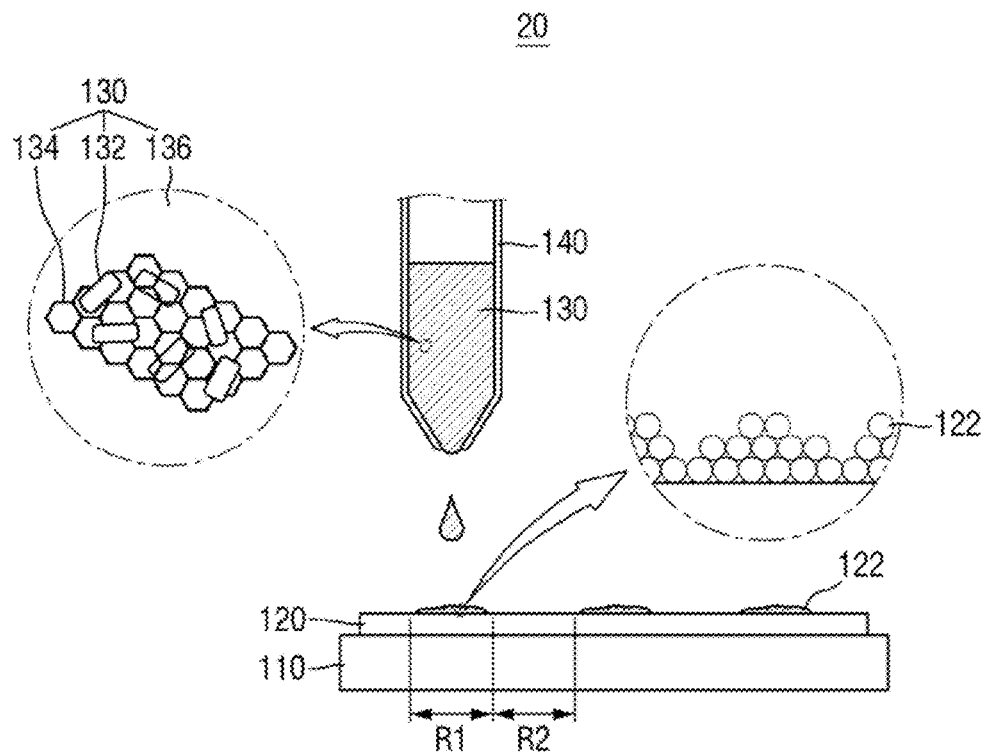
FIGS. 2A and 2B are diagrams of a hybrid provider of FIG. 1.
Figure 2B:
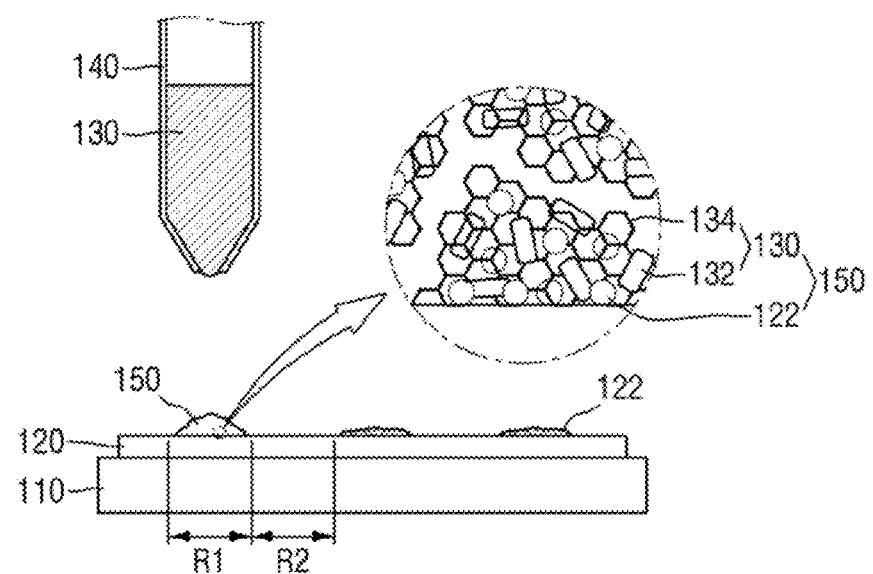
Figure 3:
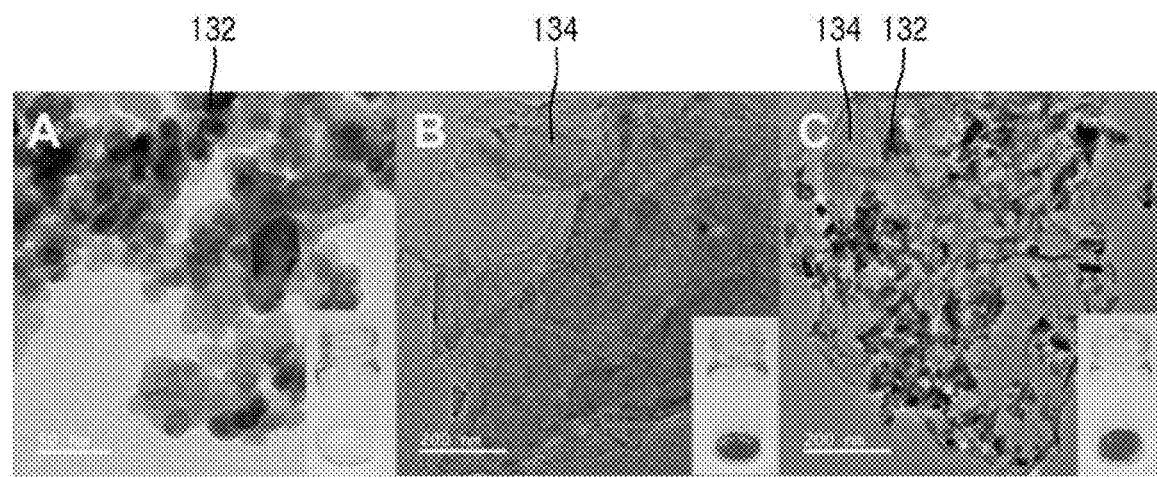
FIG. 3 is a view of exemplary TEM images of ZnO, graphene and a ZnO-graphene hybrid.
Figure 4:
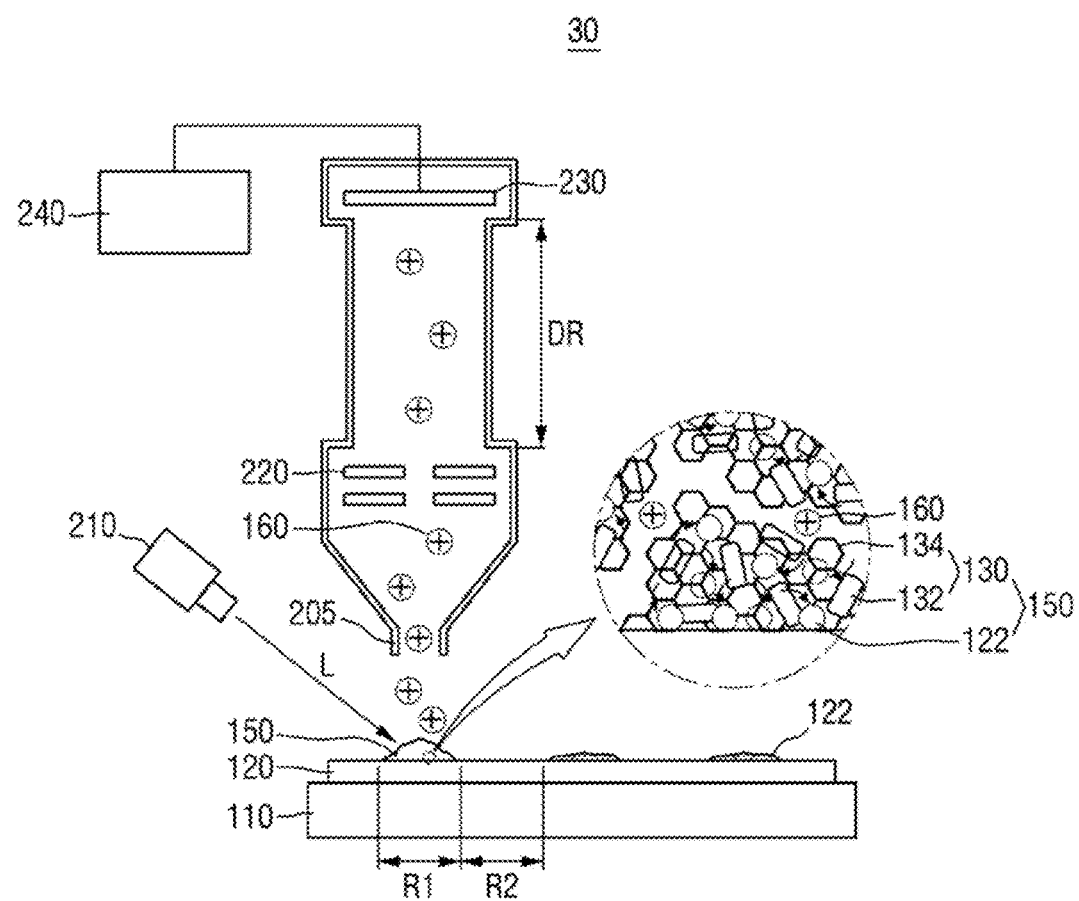
FIG. 4 is a diagram of a mass analyzer of FIG. 1.
Figure 5:
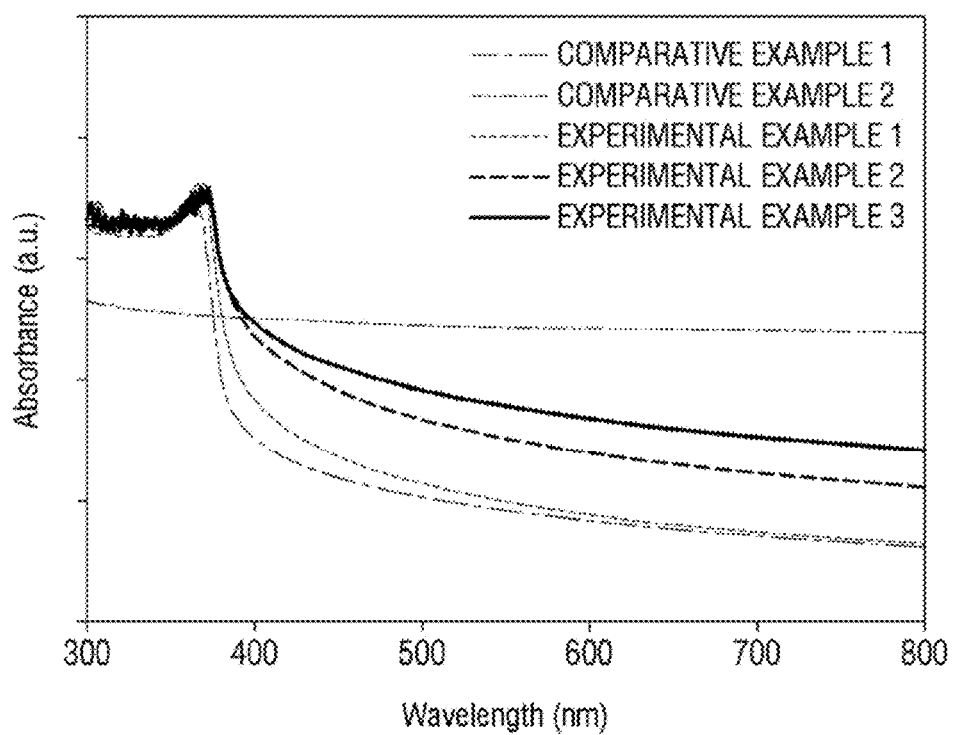
FIGS. 5 and 6 are graphs of exemplary wavelength and absorbance values for Examples and Comparative Examples.
Figure 6:
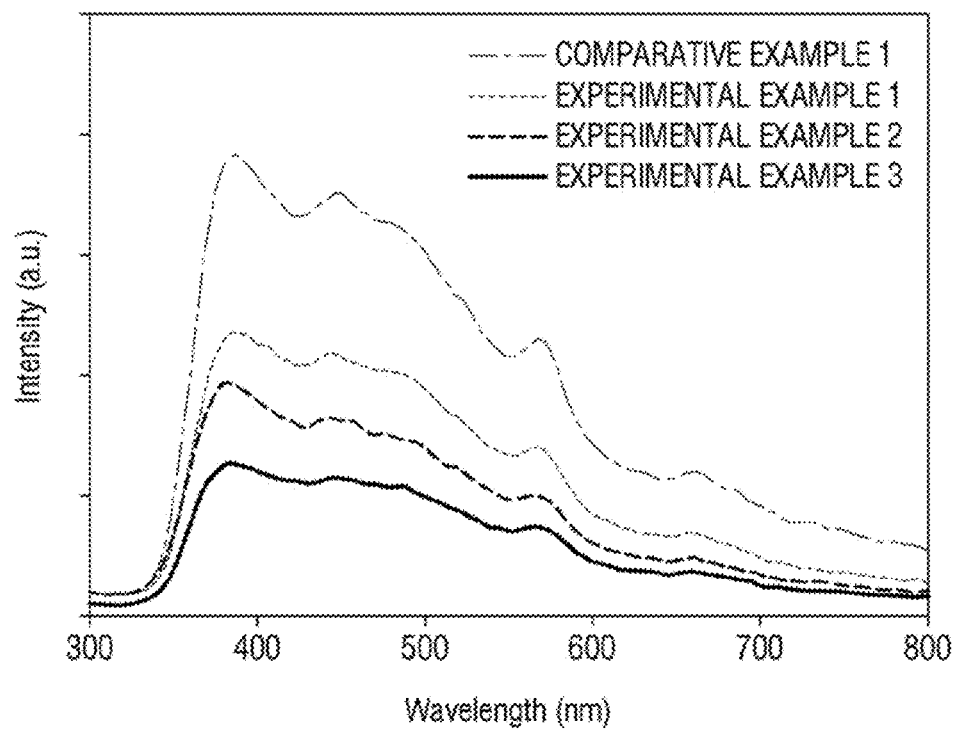

FIG. 1 is a block diagram of an apparatus for mass spectrometry according to an exemplary embodiment of the present inventive concept. FIGS. 2A and 2B are diagrams of a hybrid provider of FIG. 1. FIG. 3 is a view of TEM images of ZnO, graphene and a ZnO-graphene hybrid. FIG. 4 is a diagram of a mass analyzer of FIG. 1. FIGS. 5 and 6 are graphs of exemplary wavelength and absorbance values for Examples and Comparative examples.

Referring to FIGS. 1, 2A, 2B and 3 to 6, an apparatus for mass spectrometry 10 according to an exemplary embodiment of the present inventive concept may include a hybrid provider 20 and a mass analyzer 30.

Each of the elements of the apparatus for mass spectrometry 10 (e.g., the hybrid provider 20 and the mass analyzer 30) and their sub-elements may be either entirely hardware, or partially hardware and partially software. For example, each of the elements of the apparatus for mass spectrometry 10 may includes devices for performing the intended functions as well as software for executing and/or processing data obtained by such devices. In addition, each element of the apparatus for mass spectrometry 10 and their sub-elements are not necessarily limited to a single physical device but may refer to an assembly or a combination of plurality of elements used together to achieve an intended function.

The hybrid provider 20 may provide a ZnO-graphene hybrid 130 on the substrate 120. For example, the hybrid provider 20 may provide the ZnO-graphene hybrid 130 using a micropipette 140.

In an exemplary embodiment of the present inventive concept, the ZnO-graphene hybrid 130 may be provided in the form of a suspension. For example, the hybrid provider 20 may provide a suspension in which the ZnO-graphene hybrid 130 is dispersed in a dispersion medium 136. For example, the dispersion medium 136 may be liquid in which the ZnO-graphene hybrid 130 is suspended. The dispersion medium 136 may include, but is not limited to, deionized water.

The substrate 120 may include a semiconductor wafer. The substrate 120 may be interchangeably referred to as a semiconductor wafer 120. The substrate 120 may include, for example, a bulk silicon substrate or a SOI (silicon-on-insulator) substrate. The substrate 120 may be a silicon substrate or may be a substrate including other materials, such as silicon germanium (SiGe), indium antimonide (InSb), lead-telluride (PbTe) compound, indium arsenide (InAs), indium phosphide (InP), gallium arsenide (GaAs) or gallium antimonide (GaSb). Alternatively, the substrate 120 may be formed by growing an epitaxial layer on a base substrate. It is, however, to be understood that exemplary embodiments of the present inventive concept are not limited thereto. The substrate 120 may include a variety of substrates used for mass spectrometry.

The substrate 120 may be disposed on a plate 110. The plate 110 may be stationary, but may be movable if desired. For example, the plate 110 may be fixed in position (e.g., by a securing arm). The substrate 120 may be fixed to the plate 110. As an example, the plate 110 may be moved in the up, down, left and right directions, moved at any desired angle or rotated. Accordingly, the substrate 120 on the plate 110 may be movable.

The substrate 120 may include an analyte 122. The analyte 122 is a target to be analyzed by the apparatus for mass spectrometry 10. The analyte 122 may be present on some regions of the substrate 120, while not being present on other regions of the substrate 120. For example, the substrate 120 may include a first region R1 where the analyte 122 is present and a second region R2 where no analyte is present. Alternatively, the analyte 122 may cover substantially an entire surface (e.g., an upper surface) of the substrate 120.

In an exemplary embodiment of the present inventive concept, the analyte 122 may include organic matter. For example, the analyte 122 may include an aromatic hydrocarbon compound or an aliphatic hydrocarbon compound. In an exemplary embodiment of the present inventive concept, the analyte 122 may include a material having a relatively low molecular weight. For example, the analyte 122 may include organic matter having a relatively low molecular weight of 1,000 Da or less. In an exemplary embodiment of the present inventive concept, the analyte 122 may include a solid material. For example, the analyte 122 may include solid organic matter.

The ZnO-graphene hybrid 130 may include ZnO 132 and graphene 134. For example, the hybrid provider 20 may provide the ZnO-graphene hybrid 130 in which ZnO 132 and graphene 134 are mixed. The ZnO 132 and graphene 134 may be substantially homogenously mixed. Alternatively, the ZnO 132 and graphene 134 may be non-homogenously mixed.

In an exemplary embodiment of the present inventive concept, the ZnO-graphene hybrid 130 may include ZnO nanoparticles and reduced graphene oxide (rGO). For example, the ZnO 132 may be a ZnO nanoparticle, and the graphene 134 may be reduced graphene oxide. The ZnO nanoparticles may include, but are not limited to, ZnO nanorods.

Referring to FIG. 2A, the ZnO 132 may be attached to the graphene 134. For example, the ZnO 132 may be attached to the graphene 134 by intermolecular bonding such as hydrogen bonding and/or coordination bonding.

The ZnO-graphene hybrid according to an exemplary embodiment of the present inventive concept will be described in more detail below with reference to Examples and Comparative Examples below. It is, however, to be understood that Examples below are merely illustrative and exemplary embodiments of the present inventive concept are not limited thereto.

EXAMPLE 1

ZnO Nanoparticle 7.38 g of $Zn(OAc).2H_2O$ may be dissolved in methanol at 60° C. to prepare a solution. Subsequently, 3.7 g of KOH dissolved in 16.25 mL of the methanol may be mixed with the solution, and may be magnetically stirred at 60° C., to allow them to react with each other for five days. Subsequently, the resulting particles may be separated by centrifugation at 3,000 rpm for 15 minutes, washed with methanol and deionized water, and dried at 50° C. under vacuum. As a result, ZnO nanoparticles may be produced.

Graphene Oxide

During magnetic stirring, 37.5 mL of $H_2SO_4$ may be slowly added to a flask including 0.38 g of $NaNO_3$ and 0.5 g of graphite powder. After 30 minutes, 2.25 g of $KMnO_4$ may be added relatively slowly and stirring may be continued for five days at room temperature. Subsequently, 70 ml of diluted, five mass % $H_2SO_4$ may be added at room temperature, which was stirred at 90° C. for two hours, then 3 ml of $H_2O_2$ may be added and stirred at room temperature for two hours. The resulting solution may be centrifuged at 6,000 rpm for ten minutes and washed with a mixture of 3 wt % $H_2SO_4$, 0.5 wt % $H_2O_2$ and 3 wt % HCl. The resulting product may then be washed repeatedly with deionized water until the pH becomes neutral, and may be dried overnight at 40° C. under vacuum. As a result, graphene oxide may be produced.

ZnO-Graphene Hybrid 0.5 g of the ZnO nanoparticles may be added to a suspension in which the graphene oxide was added to a mixture of 65 mL of deionized water and 32.5 ml, of ethanol, to produce a ZnO-graphene oxide mixture. In doing so, 2 wt % of the graphene oxide may be used for 100 wt % of the ZnO-graphene oxide mixture. Subsequently, the ZnO-graphene oxide mixture may be placed in a Teflon-lined autoclave while being stirred at room temperature for two hours. The temperature may then be raised to and held at 180° C. for 12 hours. As a result, the graphene oxide may be converted to reduced graphene oxide (rGO). The resulting precipitate may then be separated by filtration, centrifuged at 3,000 rpm for 20 minutes, and dispersed again in deionized water. Subsequently, the resulting product may be dried at 50° C. under vacuum, to produce a ZnO-graphene hybrid powder.

EXAMPLE 2

In Example 2, a ZnO-graphene hybrid may be produced in substantially the same manner as in Example 1, except that the content of the graphene oxide may be changed to 4 wt % with respect to 100 wt % of the ZnO-graphene oxide mixture.

EXAMPLE 3

In Example 3, a ZnO-graphene hybrid may be produced in substantially the same manner as in Example 1, except that the content of the graphene oxide may be changed to 8 wt % with respect to 100 wt % of the ZnO-graphene oxide mixture.

Comparative Example 1

ZnO nanoparticles may be produced. It is to be noted that the ZnO nanoparticles may be produced in substantially the same manner as in Example 1.

Comparative Example 2

Reduced graphene oxide may be produced. The reduced graphene oxide may be produced in substantially the same manner as Example 1, except that ZnO particles are not added.

FIG. 3 is a view of exemplary TEM images of ZnO, graphene and a ZnO-graphene hybrid.

FIG. 3 includes image A, image B and image C. Referring to FIG. 3, in the ZnO-graphene hybrid 130 produced, the ZnO 132 can be successfully attached to the graphene 134 and hybridized without any deformation due to such hybridization. For example, the ZnO 132 can be attached to the graphene 134 without deformation of the shape of the nanorods. Further, according to the hybridization, white ZnO 132 may be changed to black ZnO graphene hybrid 130.

The hybrid provider 20 may provide the ZnO-graphene hybrid 130 to a predetermined region of the substrate 120. For example, the hybrid provider 20 may provide the ZnO-graphene hybrid 130 in the first region R1 of the substrate 120 (see, e.g., FIG. 2A).

Referring to FIG. 2B, the analyte 122 in the first region R1 may be adsorbed on the ZnO-graphene hybrid 130, to produce a mixed sample 150. For example, the hybrid provider 20 may provide the ZnO-graphene hybrid 130 in the form of a suspension on the analyte 122. Subsequently, the analyte 122 and the ZnO-graphene hybrid 130 are dried, to produce the mixed sample 150.

If the analyte 122 includes an organic matter, the analyte 122 may form a π-π bond and/or a hydrophobic bond with the graphene portion of the ZnO-graphene hybrid 130. As a result, the analyte 122 can be relatively easily adsorbed on the ZnO-graphene hybrid 130.

The mass analyzer 30 can detect the analyte 122 using laser desorption/ionization mass spectrometry (LDI-MS). For example, the mass analyzer 30 may perform mass spectrometry in a predetermined region of the substrate 120.

Referring to FIG. 4, the mass analyzer 30 may include, for example, a light irradiation unit 210, an inlet 205, an optical system 220, an ion detection unit 230, and an imaging unit 240. It is, however, to be understood that exemplary embodiments of the present inventive concept are not limited thereto. The mass analyzer 30 may include a variety of elements for performing laser desorption/ionization mass spectrometry.

The light irradiation unit 210 can irradiate a predetermined region of the substrate 120 with light L. For example, the light irradiation unit 210 may irradiate the mixed sample 150 in the first region R1 of the substrate 120 with the light L. The light irradiation unit 210 may include one or more optical members for focusing the light L on the substrate 120. For example, the light irradiation unit 210 may include, but is not limited to, a solid yttrium aluminum garnet (YAG) laser light source.

The light irradiation unit 210 can ionize the analyte 122. The mixed sample 150 may absorb energy from the irradiated light L. The absorbed energy may be transmitted to the analyte 122 through an energy transfer process. In an exemplary embodiment of the present inventive concept, the light L may include a pulsed laser having a wavelength of from about 300 nm to about 400 nm. For example, the ZnO-graphene hybrid 130 may absorb energy from the irradiated light.

Referring to FIG. 5, Comparative Example 1, Examples 1 to 3 including ZnO nanoparticles exhibit relatively strong absorption at a wavelength of approximately 300 to 400 nm. It is to be noted that FIG. 5 shows UV-Vis (ultraviolet-visible spectrometry) absorption spectra of Comparative Example 1, Comparative Example 2 and Examples 1 to 3. In contrast, Comparative Example 2, which does not include ZnO nanoparticles, does not exhibit strong absorption at a wavelength of approximately 300 to 400 nm. From the above, it can be seen that the ZnO nanoparticles may relatively strongly absorb light having a wavelength of from about 300 to about 400 nm.

In addition, as compared with Comparative Example 1, Examples 1 to 3 exhibit a higher light absorption. For light of approximately 355 nm or more, Examples 1 to 3 exhibit red-shift phenomenon. Thus, Examples 1 to 3 including the ZnO-graphene hybrid exhibit a higher light absorption than Comparative Example 1 including only ZnO. It can be seen that this phenomenon is increased as the content of reduced graphene oxide is increased. From the above, it can be seen that the ZnO-graphene hybrid 130 exhibits a higher light absorptivity than ZnO that is not hybridized with graphene.

In addition, the ZnO-graphene hybrid 130 may transfer the absorbed energy. For example, the grapheme portion of the ZnO-graphene hybrid 130 can transfer the absorbed energy to the analyte 122. Accordingly, the analyte 122 may be desorbed and ionized from the ZnO-graphene hybrid 130, to produce an ionized analyte 160.

FIG. 6 is a graph showing photoluminescence (PL) spectra for Comparative Example 1, Comparative Example 2, and Examples 1 to 3. In FIG. 6, Examples 1 to 3 including the ZnO-graphene hybrid exhibit a weaker photoluminescence than that of Comparative Example 1 including only ZnO. In addition, it can be seen that the intensity of the photoluminescence may be increased as the content of the graphene oxide is increased. It can be seen that the ZnO-graphene hybrid can transfer the energy absorbed from the irradiated light in this manner.

In an exemplary embodiment of the present inventive concept, the ZnO-graphene hybrid 130 may include approximately 1 wt % to 7 wt % of graphene 134 relative to 100 wt % of the ZnO-graphene hybrid 130. If the content of graphene 134 is less than approximately 1 wt %, the ZnO-graphene hybrid 130 may fail to transfer a sufficient energy to the analyte 122. If the content of the graphene 134 is greater than approximately 7 wt % (i.e., if the content of the ZnO 132 is relatively low), the ZnO-graphene hybrid 130 may fail to absorb an energy required for sufficiently ionizing the analyte 122.

As an example, the ZnO-graphene hybrid 130 may include approximately 1.5 to 6 wt % of graphene 134 relative to 100 wt % of the ZnO-graphene hybrid 130.

The inlet 205 may receive the ionized analyte 160. For example, the ionized analyte 160 created by the light irradiation unit 210 may pass through the inlet 205.

The optical system 220 may accelerate the ionized analyte 160. Further, the optical system 220 may select ions to be detected. The optical system 220 may include one or more electrostatic lenses. For example, the optical system 220 may include an electrode that applies an electric field and has a hole for passing the ionized analyte 160 therethrough.

In an exemplary embodiment of the present inventive concept, the optical system 220 may be further disposed adjacent to the ion detection unit 230 to decelerate the ionized analyte 160.

The ion detection unit 230 may detect the ionized analyte 160 flying in an ion drift region DR to generate mass data of the analyte 122. For example, the ionized analyte 160 accelerated by the optical system may fly in the ion drift region DR having a predetermined length. Within the ion drift region DR, each ion of the ionized analyte 160 may be separated based on its mass-to-charge ratio (m/z). Accordingly, the mass-to-charge ratio of an ion can be specified using the time taken for the ion to reach the ion detection unit 230, such that the mass data of the analyte 122 can be generated.

In an exemplary embodiment of the present inventive concept, the ion detection unit 230 may be disposed in a reflection mode. For example, the mass analyzer 30 may further include a deflector disposed in the propagation direction of ions. The deflector may reflect the ionized analyte 160 flying in the ion drift region DR toward the side where the ion detection unit 230 is disposed.

The imaging unit 240 may be connected to the ion detection unit 230. The imaging unit 240 may provide mass image by using the mass data generated from the ion detection unit 230. For example, the imaging unit 240 may provide the intensity of the ions separated based on the mass-to-charge ratio in the form of a mass spectrum.

In an exemplary embodiment of the present inventive concept, the imaging unit 240 may select only ions within a predetermined mass range to provide a mass image.

The imaging unit 240 may include, but is not limited to, a personal computer (PC).

Figure 7:
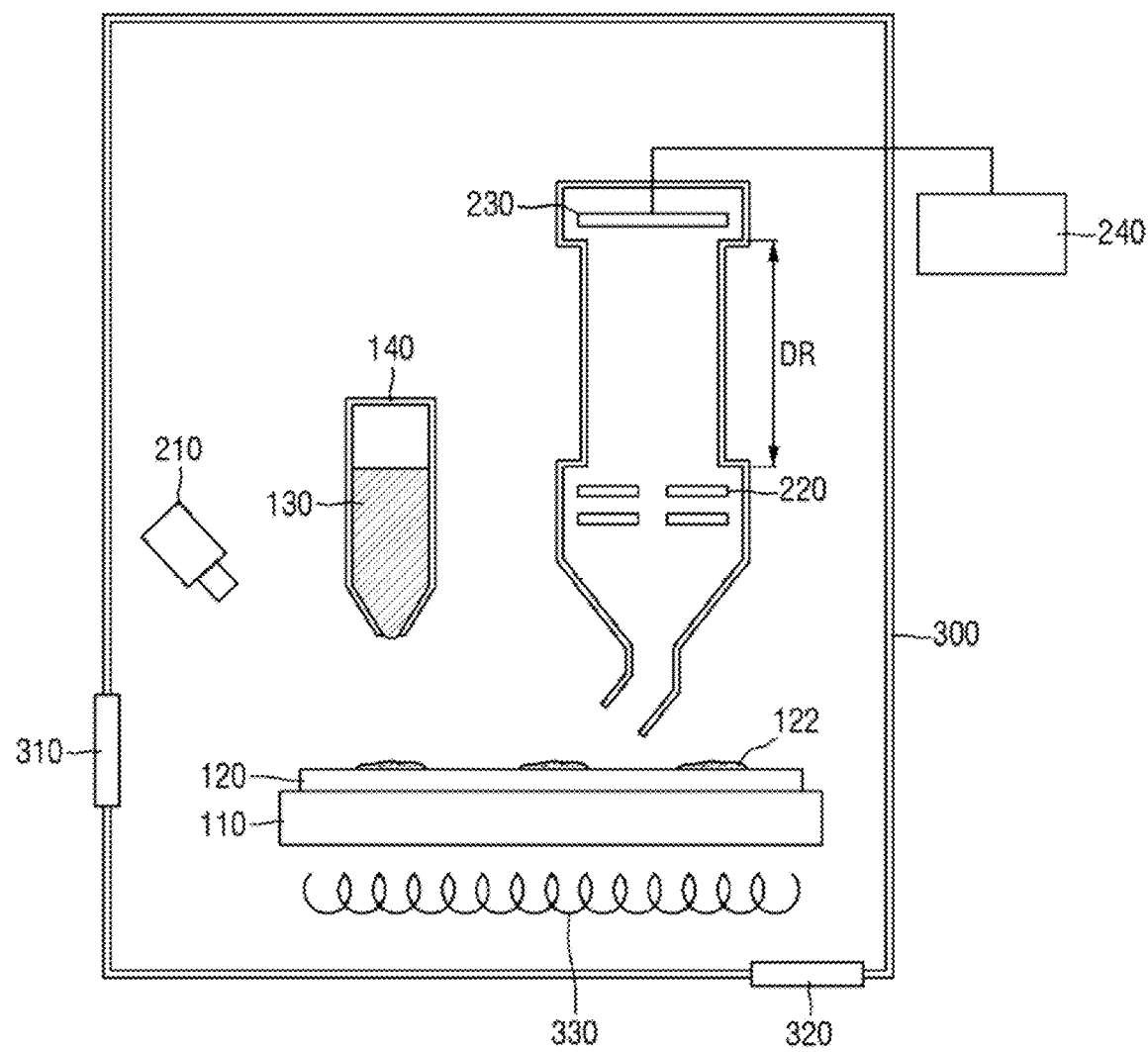
FIG. 7 is a diagram of a mass analyzer according to an exemplary embodiment of the present inventive concept.

FIG. 7 is a diagram of a mass analyzer according to an exemplary embodiment of the present inventive concept. Descriptions of components that are the same or substantially the same as those described above may be omitted below, and thus differences from the exemplary embodiments of the present inventive concept described above may be focused on below. Descriptions of technical features or aspects of an exemplary embodiment of the present inventive concept should typically be considered as available and applicable to other similar features or aspects in another exemplary embodiment of the present inventive concept. Accordingly, technical features described herein according to one exemplary embodiment of the present inventive concept may be applicable to other exemplary embodiments of the present inventive concept, and thus duplicative descriptions may be omitted herein.

Referring to FIG. 7, a mass analyzer according to an exemplary embodiment of the present inventive concept may include a plate 110, a substrate 120, a micropipette 140, a light irradiation unit 210, an inlet 205, an optical system 220, an ion detection unit 230, an imaging unit 240, and a chamber 300.

The chamber 300 may have a hollow cylindrical shape. Alternatively, the chamber 300 may have a circular, square or rectangular barrel shape.

The chamber 300 may provide a space for providing ZnO-graphene hybrid 130 and performing mass spectrometry. For example, the plate 110, the substrate 120, the inlet 205, the optical system 220 and the ion detection unit 230 may be disposed in the chamber 300. It is, however, to be understood that exemplary embodiments of the present inventive concept are not limited thereto. In an exemplary embodiment of the present inventive concept, some of the plate 110, the substrate 120, the inlet 205, the optical system 220 and the ion detection unit 230 may be disposed outside the chamber 300.

In an exemplary embodiment of the present inventive concept, the plate 110 may be movable in the chamber 300. The plate 110 is movable in the chamber 300, and may move the substrate 120. The substrate 120 may be fixed to the plate 110. For example, the ZnO-graphene hybrid 130 may be provided in a predetermined region on the substrate 120 by moving the plate 110. Alternatively, mass spectrometry may be carried out on a predetermined region on the substrate 120 by moving the plate 110.

In an exemplary embodiment of the present inventive concept, the chamber 300 may include a door 310. Through the door 310, the substrate 120 may be inserted into or taken out of the chamber 300. It is, however, to be understood that exemplary embodiments of the present inventive concept are not limited thereto. The chamber 300 may include another opening/closing mechanism for loading/removing the substrate 120 into/from the chamber 300.

In an exemplary embodiment of the present inventive concept, the chamber 300 may be a vacuum chamber. For example, the chamber 300 may include a pressure controller 320. The pressure controller 320 may create and maintain a vacuum inside the chamber 300. In addition, the pressure controller 320 may discharge impurities inside the chamber 300. The pressure controller 320 may include, but is not limited to, a vacuum pump.

In an exemplary embodiment of the present inventive concept, the chamber 300 may include a temperature controller 330. The temperature controller 330 may control the temperature inside the chamber 300. For example, the temperature controller 330 may heat or cool the inside of the chamber 300 in which vacuum state is created. For example, the temperature controller 330 may heat up or cool down the plate 110.

A mixed sample according to an exemplary embodiment of the present inventive concept will be described in more detail below with reference to Examples and Comparative Examples. It is, however, to be understood that Examples below are merely illustrative and the present inventive concept is not limited thereto.

EXAMPLE 1

A mixed sample may be produced by providing a ZnO-graphene hybrid to the analyte. As described above, in an exemplary embodiment of the present inventive concept, a ZnO-graphene hybrid may be produced using 2 wt % of graphene oxide with respect to 100 wt % of the ZnO-graphene oxide mixture.

Analyte

Silicon (Si) wafers may be ultrasonically cleaned with acetone and IPA (isopropyl alcohol) and immersed in a 0.5% HF solution for at least ten minutes to remove the silicon oxide film. Subsequently, the silicon wafer may be washed with deionized water and dried in vacuum for 30 minutes. A B[a]P solution may be produced by diluting 1 mg/mL of a B[a]P(benzo[a]pyrene) stock solution in acetone with an acetone/deionized water mixture (60:40, volume/volume). Using a micropipette, 2 µL of the prepared B[a]P solution may be placed on a silicon wafer and dried under vacuum. In this manner, an analyte having a surface concentration of $1.7*1,016$ C atoms/cm$^2$ may be produced. The surface concentration (C atoms/cm$^2$) of the analyte may be calculated per unit area on the silicon wafer, e.g., 0.0225 cm$^2$.

Mixed Sample

Using a micropipette, 2 µL of a suspension in which ZnO-graphene hybrid is dispersed in deionized water at the concentration of 10 ng/µL may be added to a predetermined region of the silicon wafer on which the analyte was dried. Thus, 20 ng of ZnO-graphene hybrid may be added. Subsequently, a mixed sample may be produced by drying the mixed sample for 30 minutes under vacuum.

EXAMPLE 2

In Example 2, a mixed sample may be produced in substantially the same manner as in Example 1, except that the content of the graphene oxide may be changed to 4 wt % with respect to 100 wt % of the ZnO-graphene oxide mixture.

EXAMPLE 3

In Example 3, a mixed sample may be produced in substantially the same manner as in Example 1, except that the content of the graphene oxide may be changed to 8 wt % with respect to 100 wt % of the ZnO- graphene oxide mixture.

EXAMPLE 4

In Example 4, a mixed sample may be produced in substantially the same manner as in Example 1, except that the concentration of the ZnO-graphene hybrid may be changed to 1 ng/µL. Thus, 2 ng of ZnO-graphene hybrid may be used.

EXAMPLE 5

In Example 5, a mixed sample may be produced in substantially the same manner as in Example 1, except that the concentration of the ZnO-graphene hybrid may be changed to 100 ng/µL. Thus, 200 ng of ZnO-graphene hybrid may be used.

EXAMPLE 6

In Example 6, a mixed sample may be produced in substantially the same manner as in Example 1, except that the concentration of the ZnO-graphene hybrid may be changed to 1,000 ng/µL. Thus, 2,000 ng of ZnO-graphene hybrid may be used.

Comparative Example 1

In Comparative Example 1, a mixed sample may be produced in substantially the same manner as in Example 1, except that the ZnO-graphene hybrid may be replaced with the ZnO nanoparticles.

Comparative Example 2

In Comparative Example 2, a mixed sample may be produced in substantially the same manner as in Example 1, except that the ZnO-graphene hybrid may be replaced with the reduced graphene oxide.

Comparative Example 3

A mixed sample may be produced only with the analyte.

The performance of a mass analyzer according to an exemplary embodiment of the present inventive concept will be described in more detail below with reference to FIGS. 8 to 11.

Figure 8:
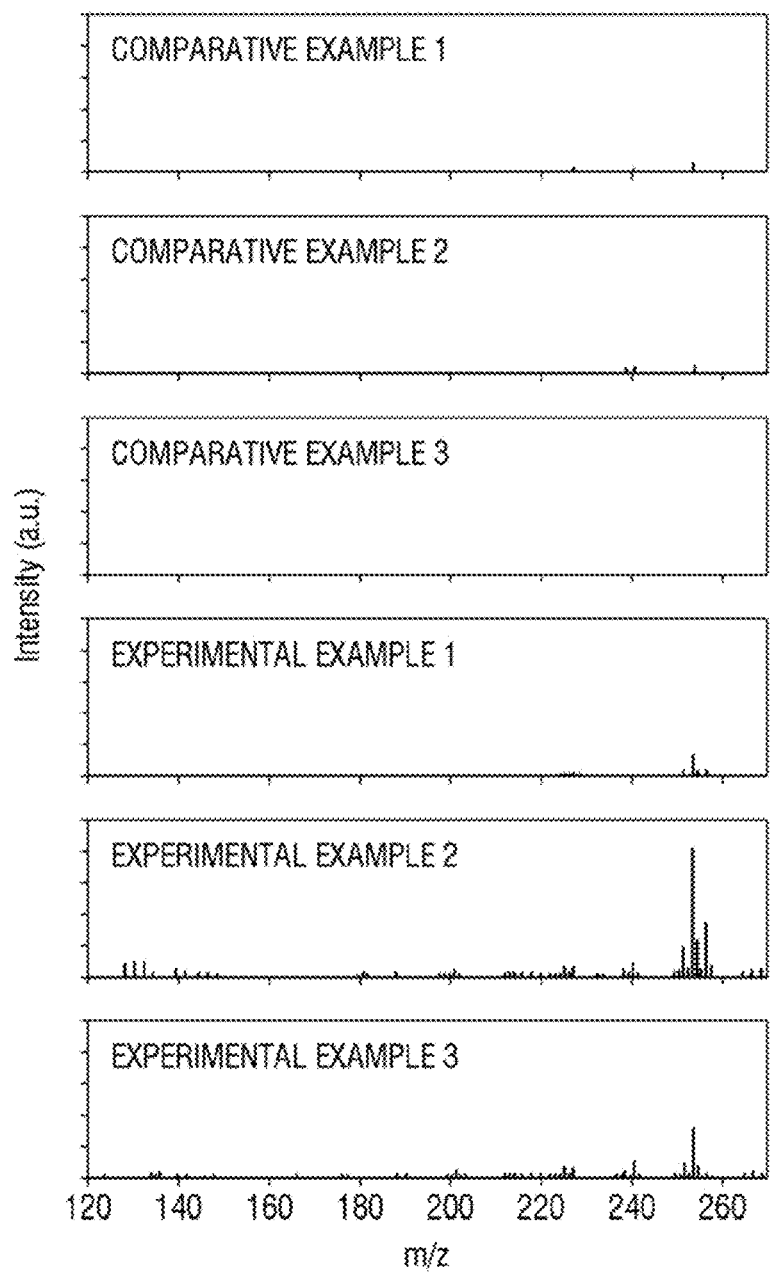
FIG. 8 shows exemplary spectra of laser desorption/ionization mass spectrometry of Comparative Examples 1 to 3 and Examples 1 to 3.

FIG. 8 shows exemplary spectra of laser desorption/ionization mass spectrometry of Comparative Examples 1 to 3 and Examples 1 to 3.

Referring to FIG. 8, Examples 1 to 3 using the ZnO-graphene hybrid may exhibit relatively strong signals in the spectra of the mass spectrometry. Comparative Example 1 using only ZnO, Comparative Example 2 using only reduced graphene oxide, and Comparative Example 3 using only the analyte may exhibit relatively weak signals in the spectra of the mass spectrometry. As described herein, the analyte having a relatively low molecular weight can be analyzed using the ZnO-graphene hybrid.

In addition, as compared with Examples 1 and 3, Example 2 exhibits a relatively stronger signal in the spectrum of the mass spectrometry. In the apparatus for mass spectrometry according to an exemplary embodiment of the present inventive concept, the ZnO-graphene hybrid produced using approximately 2 wt % to 8 wt % of the graphene oxide with respect to 100 wt % of the ZnO-graphene oxide mixture may perform relatively well in detecting the analyte.

Figure 9:
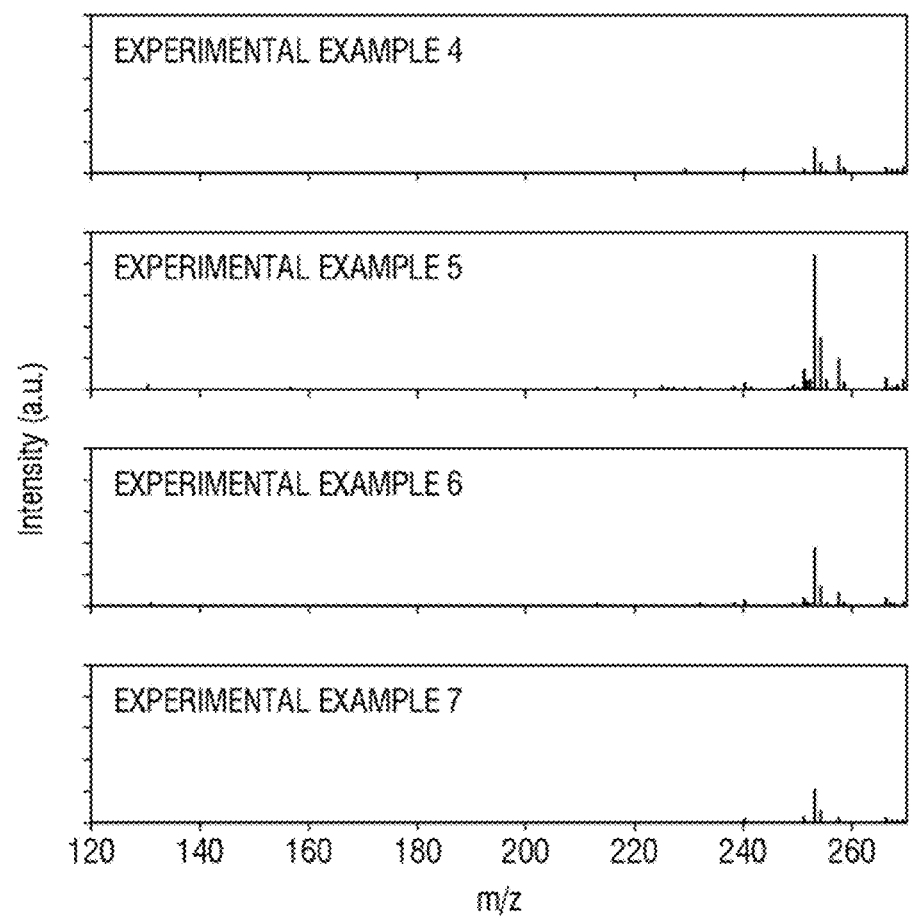
FIG. 9 shows exemplary spectra of laser desorption/ionization mass spectrometry of Example 4 to 7.

FIG. 9 shows exemplary spectra of laser desorption/ionization mass spectrometry of Examples 4 to 7.

In Examples 4 to 7, signals are shown in the spectra of the mass spectrometry. Thus, in the apparatus for mass spectrometry according to an exemplary embodiment of the present inventive concept, approximately 2 to 2,000 ng of ZnO-graphene hybrid per unit area. (0.0225 cm$^2$) may be used.

Referring to FIG. 9, as compared with Examples 4, 6 and 7, Example 5 exhibits a relatively stronger signal in the mass spectrometry spectrum. As described herein, in the apparatus for mass spectrometry according to an exemplary embodiment of the present inventive concept, approximately 20 ng of ZnO-graphene hybrid per unit area (0.0225 cm$^2$) exhibits relatively strong performance (e.g., in detecting the analyte). For example, approximately 10 to 100 ng of ZnO-graphene hybrid per unit area (0.0225 cm$^2$) may exhibit relatively strong performance (e.g., in detecting the analyte).

Figure 10:
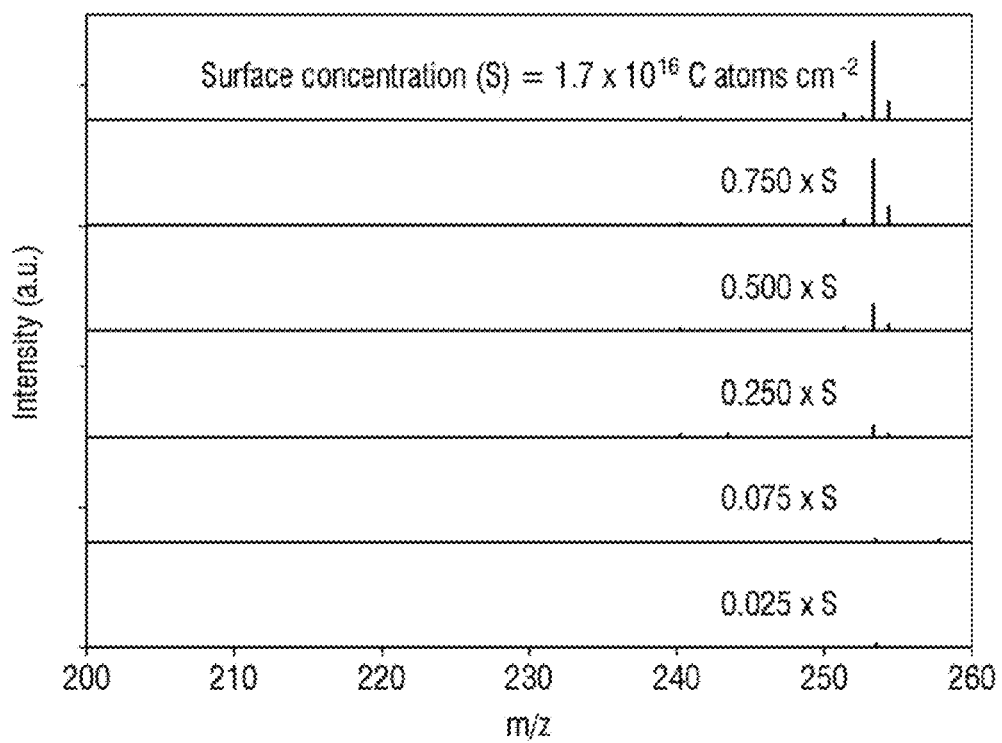
FIG. 10 shows exemplary spectra of laser desorption/ionization mass spectrometry of Example 2 for different concentrations of the analyte.
Figure 11:
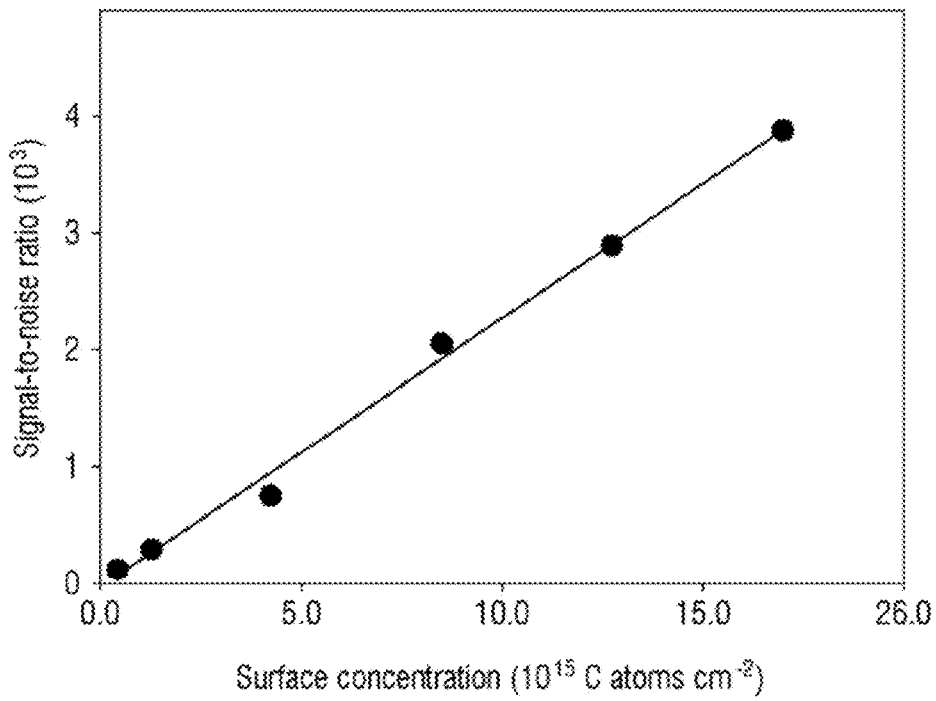
FIG. 11 is a graph of the signal-to-noise ratio of FIG. 10.

FIG. 10 shows exemplary spectra of laser desorption/ionization mass spectrometry of Example 2 for different concentrations of the analyte. FIG. 11 is a graph of the signal-to-noise ratio of FIG. 10. It is to be noted that the surface concentration (S) in FIGS. 10 and 11 represents the surface concentration of the analyte.

Referring to FIGS. 10 and 11, the apparatus for mass spectrometry according to an exemplary embodiment of the present inventive concept may exhibit a signal even for an analyte having the surface concentration of 0.025*S to 1*S, where S is 1.7*1,016 C atoms/cm$^2$.

Accordingly, the apparatus for mass spectrometer according to an exemplary embodiment of the present inventive concept may detect an analyte having a very low surface concentration. For example, the apparatus for mass spectrometry may analyze a contaminant of a semiconductor wafer. In such case, the apparatus for mass spectrometry may be able to analyze a contaminant at a surface concentration of 5*1,014 C atoms/cm$^2$ to 10*1,014 C atoms/cm$^2$.

A method for mass spectrometry according to an exemplary embodiment of the present inventive concept will be described with reference to FIGS. 2A, 2B, 3 and 12.

Figure 12:
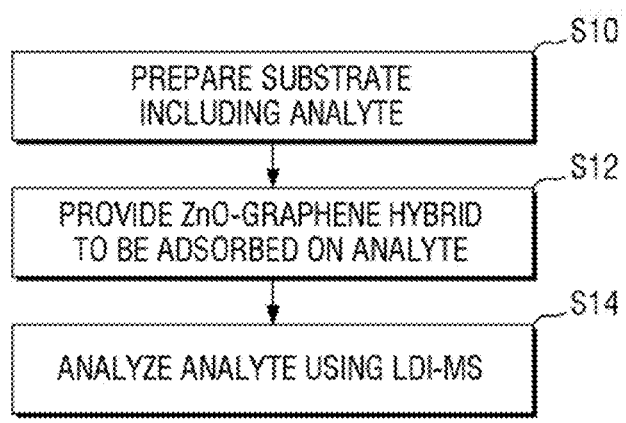
FIG. 12 is a flowchart of a method for mass spectrometry according to an exemplary embodiment of the present inventive concept.

FIG. 12 is a flowchart of a method for mass spectrometry according to an exemplary embodiment of the present inventive concept. Descriptions of components that are the same or substantially the same as those described above may be omitted below, and thus differences from the exemplary embodiments of the present inventive concept described above may be focused on below.

Referring to FIGS. 2A and 12, a substrate 120 including an analyte 122 is prepared (step S10).

In an exemplary embodiment of the present inventive concept, the analyte 122 may include an organic matter having a relatively low molecular weight of 1,000 Da or less. In addition, in an exemplary embodiment of the present inventive concept, the analyte 122 may include solid organic matter. For example, the analyte 122 may include a solid aromatic compound and/or a solid aliphatic compound.

Referring to FIGS. 2A, 2B and 12, a ZnO-graphene hybrid 130 to he adsorbed on the analyte 122 is provided (step S12). In this manner, a mixed sample 150 may be produced.

In an exemplary embodiment of the present inventive concept, the ZnO-graphene hybrid 130 may be provided by using, for example, a micropipette 140. In an exemplary embodiment of the present inventive concept, the ZnO-graphene hybrid 130 may be prepared in the form of a suspension.

In an exemplary embodiment of the present inventive concept, the method may further include drying the mixed sample 150 after the providing the ZnO-graphene hybrid 130 to be adsorbed on the analyte 122. For example, the mixed sample 150 produced by providing the ZnO-graphene hybrid 130 to the analyte 122 may be dried under vacuum.

Referring to FIGS. 3 and 12, the analyte 122 may be analyzed using laser desorption/ionization mass spectrometry (LDI-MS) (step S14).

The analysis of the analyte 122 using the laser desorption/ionization mass spectrometry may be carried out by using, for example, the mass analyzer 30 of FIG. 4. Accordingly, the method for mass spectrometry capable of analyzing an analyte having a relatively low molecular weight which may be located on a part of the substrate can be provided.

A method for mass spectrometry according to an exemplary embodiment of the present inventive concept will he described in more detail below with reference to FIGS. 2A, 2B, 3 and 13.

Figure 13:
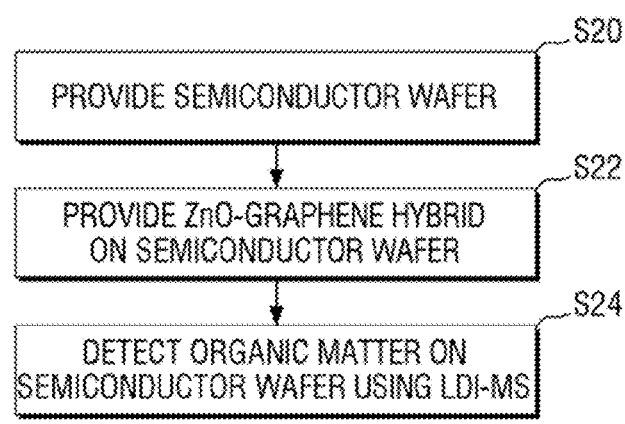
FIG. 13 is a flowchart of a method for analyzing a semiconductor wafer according to an exemplary embodiment of the present inventive concept.

FIG. 13 is a flowchart of a method for analyzing a semiconductor wafer according to an exemplary embodiment of the present inventive concept. Descriptions of components that are the same or substantially the same as those described above may be omitted below, and thus differences from the exemplary embodiments of the present inventive concept described above may be focused on below.

Referring to FIG. 13, a semiconductor wafer is provided (step S20).

For example, the substrate 120 of FIG. 2A may include a semiconductor wafer. In an exemplary embodiment of the present inventive concept, the analyte 122 on the substrate 120 may include a solid organic matter. For example, the analyte 122 may be an organic contaminant having a relatively low molecular weight that remains on a region of the semiconductor wafer.

Subsequently, a ZnO-graphene hybrid is provided on the semiconductor wafer (step S22).

In an exemplary embodiment of the present inventive concept, the providing of the ZnO-graphene hybrid may include mixing the ZnO nanoparticles with graphene oxide to produce a ZnO-graphene oxide mixture and reducing the ZnO-graphene oxide mixture.

In an exemplary embodiment of the present inventive concept, the ZnO-oxidized graphene mixture may include approximately 2 wt % to 8 wt % of the graphene oxide with respect to 100 wt % of the ZnO-graphene oxide mixture. Accordingly, the ZnO-graphene hybrid 130 having approximately 1 wt % to 7 wt % of graphene 134 with respect to 100 wt % of the ZnO-graphene hybrid 130 can be produced.

In an exemplary embodiment of the present inventive concept, the providing of the ZnO-graphene hybrid 130 may include providing approximately 2 to 2,000 ng of ZnO-graphene hybrid 130 per unit area (0.0225 cm2).

Subsequently, the analyte 133 is analyzed using the laser desorption/ionization mass spectrometry (LDI-MS). Thus, organic matter is detected on the semiconductor wafer using LDI-MS (step S24).

In this manner, it is possible to analyze, for example, an organic contaminant having a relatively low molecular weight that remains on a region of a semiconductor wafer.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. An apparatus for mass spectrometry comprising:
a plate on which a semiconductor wafer comprising an organic matter is disposed;
a hybrid provider that provides a ZnO-graphene hybrid to a predetermined region on the semiconductor wafer; and
a mass analyzer that detects the organic matter in the predetermined region using laser desorption/ionization mass spectrometry (LDI-MS).

2. The apparatus of claim 1, wherein the ZnO-graphene hybrid includes ZnO nanoparticles and reduced graphene oxide (rGO).

3. The apparatus of claim 2, wherein the ZnO-graphene hybrid includes 1.5 wt % to 6 wt % of the reduced graphene oxide with respect to 100 wt % of the ZnO-graphene hybrid.

4. The apparatus of claim 1, wherein the organic matter has a molecular weight equal to or less than 1,000 Da.

5. The apparatus of claim 1, wherein the organic matter comprises at least one of a solid aromatic compound or a solid aliphatic compound.

6. The apparatus of claim 1, wherein the hybrid provider provides a suspension in which the ZnO-graphene hybrid is dispersed in the predetermined region.

7. The apparatus of claim 1, wherein the hybrid provider provides from 2 ng to 2,000 ng of the ZnO-graphene hybrid per unit area of 0.0225 $cm^2$ of the predetermined region.

8. The apparatus of claim 1, wherein the mass analyzer comprises:
a light irradiation unit that irradiates light to ionize the organic matter, to generate an ionized organic matter; and
an ion detection unit that detects the ionized organic matter and generates mass data of the organic matter.

9. An apparatus for mass spectrometry comprising:
a plate on which a substrate comprising an analyte is disposed;
a hybrid provider that provides a ZnO-graphene hybrid to be adsorbed on the analyte, to produce a mixed sample on the substrate;
a light irradiation unit that irradiates light to ionize the analyte, to generate an ionized analyte; and
an ion detection unit that detects the ionized analyte to generate mass data of the analyte.

10. The apparatus of claim 9, wherein the analyte comprises a solid organic matter.

11. The apparatus of claim 9, wherein the hybrid provider comprises a micropipette.

12. The apparatus of claim 9, wherein the light irradiation unit desorbs the analyte from the ZnO-graphene hybrid to ionize the analyte.

13. The apparatus of claim 9, wherein the light irradiation unit irradiates a pulsed laser having a wavelength of from 300 nm to 400 nm.

14. The apparatus of claim 9, further comprising: an optical system that accelerates the ionized analyte.

15. The apparatus of claim 9, further comprising: a temperature controller; and a pressure controller.

16. A method for mass spectrometry comprising:
preparing a semiconductor wafer comprising an organic matter;
providing a ZnO-graphene hybrid to a predetermined region on the semiconductor wafer; and
detecting the organic matter in the predetermined region using laser desorption/ionization mass spectrometry (LDI-MS).

17. The method of claim 16, wherein the providing the ZnO-graphene hybrid comprises
mixing ZnO nanoparticles with graphene oxide to produce a ZnO-graphene oxide mixture; and
reducing the ZnO-graphene oxide mixture.

18. The method of claim 17, wherein the ZnO-graphene oxide mixture includes from 2 wt % to 8 wt % of the graphene oxide with respect to 100 wt % of the ZnO-graphene oxide mixture.

19. The method of claim 16, wherein the providing the ZnO-graphene hybrid comprises providing from 2 ng to 2,000 ng of the ZnO-graphene hybrid per unit area of 0.0225 $cm^2$ of the predetermined region of the semiconductor wafer.

20. The method of claim 16, wherein the providing the ZnO-graphene hybrid comprises providing a suspension in which the ZnO-graphene hybrid is dispersed to the predetermined region of the semiconductor wafer.

* * * * *